(12) United States Patent  
Coburn

(10) Patent No.: US 11,486,845 B2  
(45) Date of Patent: Nov. 1, 2022

(54) PROCESSES AND SYSTEMS FOR MONITORING FILTER MATERIALS

(71) Applicant: TMGCORE, INC., Plano, TX (US)

(72) Inventor: Randall Coburn, Plano, TX (US)

(73) Assignee: TMGCore, INC., Plano, TX (US)

( * ) Notice: Subject to any disclaimer, the term of this patent is extended or adjusted under 35 U.S.C. 154(b) by 0 days.

(21) Appl. No.: 17/701,430

(22) Filed: Mar. 22, 2022

(65) Prior Publication Data

US 2022/0299460 A1 Sep. 22, 2022

Related U.S. Application Data

(60) Provisional application No. 63/164,024, filed on Mar. 22, 2021.

(51) Int. Cl.
| | | |
|---|---|---|
| *G01R 33/00* | (2006.01) | |
| *G01N 27/12* | (2006.01) | |
| *B01D 37/04* | (2006.01) | |
| *H05K 7/20* | (2006.01) | |
| *B01D 39/20* | (2006.01) | |

(52) U.S. Cl.
CPC ........... *G01N 27/125* (2013.01); *B01D 37/04* (2013.01); *B01D 39/2027* (2013.01); *H05K 7/203* (2013.01); *H05K 7/20236* (2013.01)

(58) Field of Classification Search
CPC .. G01N 27/125; B01D 37/04; B01D 39/2027; H05K 7/20236; H05K 7/203; G01R 33/00
See application file for complete search history.

(56) References Cited

U.S. PATENT DOCUMENTS

| | | | | |
|---|---|---|---|---|
| 5,507,941 | A | * 4/1996 | Pothapragada | ....... C07C 17/395 210/94 |
| 2011/0248731 | A1 | * 10/2011 | Sastry | ................ G01N 27/4167 324/693 |
| 2017/0361276 | A1 | * 12/2017 | Muir | ....................... C02F 1/444 |
| 2018/0221796 | A1 | 8/2018 | Bonifas et al. | |
| 2020/0406175 | A1 | 12/2020 | Lau | |

FOREIGN PATENT DOCUMENTS

| | | |
|---|---|---|
| WO | 2020102090 A1 | 5/2020 |
| WO | 2021048785 A1 | 3/2021 |

OTHER PUBLICATIONS

International Search Report and Written opinion dated Jun. 14, 2022 issued in PCT/US2022/21381.
Elga, Veolia Water Purity and pH: Not As Simple As You Think, [https://www.elgalabwater.com/blog/water-purity-and-ph-not-simple-you-think], pp. 1-4, Feb. 18, 2020.

* cited by examiner

*Primary Examiner* — Jermele M Hollington
*Assistant Examiner* — Taqi R Nasir
(74) *Attorney, Agent, or Firm* — Hunton Andrews Kurth LLP

(57) ABSTRACT

Systems and methods for monitoring a filter in, for example, an immersion cooled system are described. In one embodiment the application pertains to a process comprising employing a filter media to filter fluid wherein one or more electrical properties change depending upon pH of the filter fluid. The one or more electrical properties may be measured to monitor the filter. If desired, the filter media's electrical properties may be modified based on the configuration of the filter to facilitate the measurements.

20 Claims, 2 Drawing Sheets

Acid sensor for use in liquid cooling of data center equipment.

PROCESSES AND SYSTEMS FOR MONITORING FILTER MATERIALS

CROSS-REFERENCE TO RELATED APPLICATIONS

This application claims priority to U.S. Provisional Application No. 63/164,024 filed Mar. 22, 2021. This application is also related to PCT publication WO2020/102090 filed Nov. 11, 2019 titled "Liquid Immersion Cooling Platform" and U.S. Pat. No. 10,624,237 owned by TMGCore, LLC which applications are incorporated herein by reference.

FIELD OF THE DISCLOSURE

The present disclosure relates to processes and systems for monitoring a filter material used in, for example, liquid immersion cooling of high speed computer components.

BACKGROUND AND SUMMARY

Halocarbons such as perfluorocarbon liquid dielectric fluids such as NOVEC™ and oils such as mineral oil are frequently employed in immersion cooling (2-phase or single phase) of computer components such as servers. Unfortunately, at the conditions employed the halocarbons may degrade into other substances such as acids, bases, and the like. These other substances may be harmful to the computer components and/or other aspects of the systems employed. Therefore, filters comprising, for example, alumina and/or other hydrophilic chemicals and mixtures may be employed to filter the other substances.

To know when the presence of other substances is becoming potentially deleterious and/or to know when the filter material is nearing the end of its useful life typically involves visual monitoring of the filter. For example, a pH color change indicator may be employed on or near the filter as described in U.S. Pat. No. 5,507,941. Unfortunately, these current visual methods of monitoring are sometimes unreliable and/or cumbersome to implement—particularly in an enclosed system which may require a camera for the visualizing. Accordingly, what is needed are new monitoring methods and systems that are efficient and effective.

Advantageously, the instant application pertains to new monitoring methods and systems. In one embodiment the application pertains to a process comprising employing a filter media to filter fluid wherein one or more electrical properties change depending upon pH of the filter fluid. The one or more electrical properties may be measured to monitor the filter. If desired, the filter media's electrical properties may be modified based on the configuration of the filter to facilitate the measurements.

These and other objects, features and advantages of the exemplary embodiments of the present disclosure will become apparent upon reading the following detailed description of the exemplary embodiments of the present disclosure, when taken in conjunction with the appended claims.

BRIEF DESCRIPTION OF THE DRAWINGS

Various embodiments of the present disclosure, together with further objects and advantages, may best be understood by reference to the following description taken in conjunction with the accompanying drawings.

DETAILED DESCRIPTION

The following description of embodiments provides a non-limiting representative examples referencing numerals to particularly describe features and teachings of different aspects of the invention. The embodiments described should be recognized as capable of implementation separately, or in combination, with other embodiments from the description of the embodiments. A person of ordinary skill in the art reviewing the description of embodiments should be able to learn and understand the different described aspects of the invention. The description of embodiments should facilitate understanding of the invention to such an extent that other implementations, not specifically covered but within the knowledge of a person of skill in the art having read the description of embodiments, would be understood to be consistent with an application of the invention.

The systems and methods disclosed herein generally relate to systems and methods for monitoring a filter in, for example, an immersion cooled system. In one embodiment, the present application pertains to monitoring one or more electrical properties of the filter material to detect chemical changes of the dielectric fluid, e.g., halocarbon. For example, if alumina or related materials are employed as a filter material, then as the alumina neutralizes potentially deleterious substances in the dielectric fluid, the alumina's resistance changes.

Alumina generally has a very high resistance. Thus, using high-resistance meters that are available commercially is one approach to measure the resistance and thereby effectively monitor the filter.

In another embodiment it has been discovered that to effectively monitor the filter based on alumina's resistance, then it may be useful to lower its resistance in a convenient manner such it can pass a small current.

Resistance of a substance is calculated by multiplying the resistivity of the material multiplied by the length of the material and the area of the cross section.

$$R = \rho L/A \qquad \text{Equation 1: Formula for calculating resistance.}$$

$\rho$ = resistivity
$L$ = length
$A$ = cross sectional area

Figure 1:
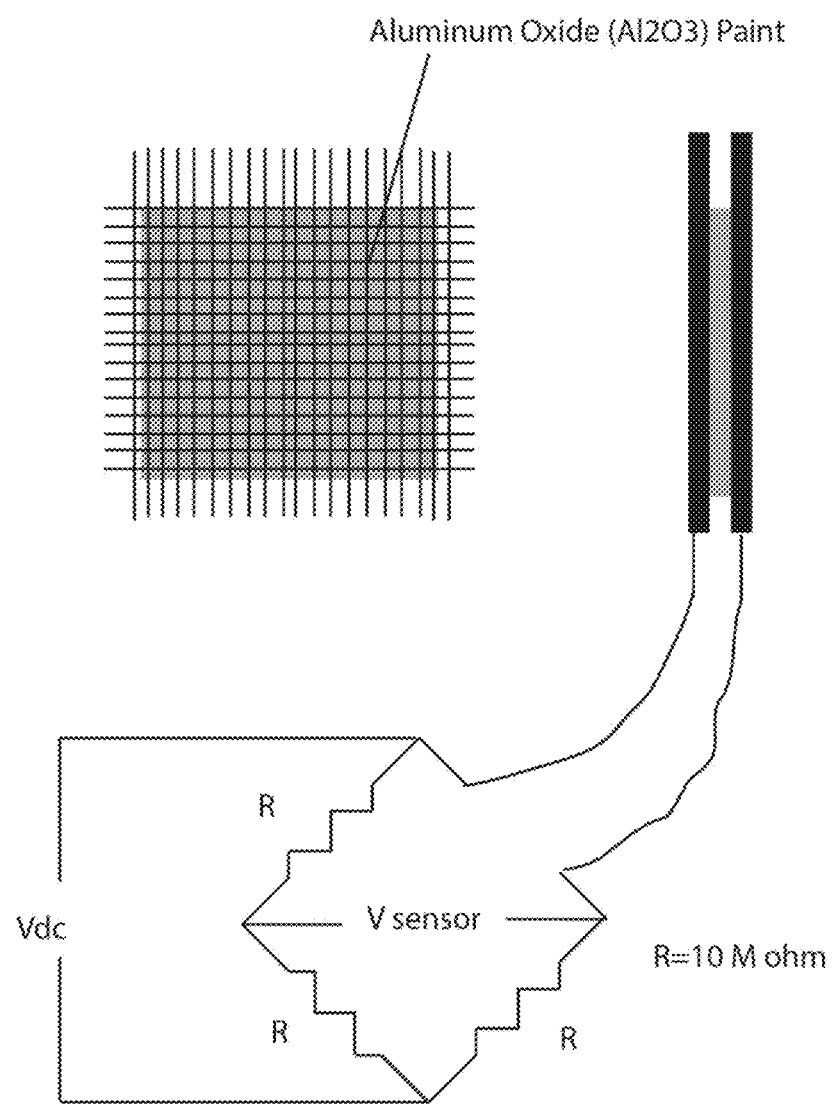
FIG. 1 shows alumina sandwiched between two copper screens and connected to a Wheatstone bridge. The screen allows the flow of halocarbon liquids increasing or maximizing the surface area for neutralization of acids or bases that are formed by decomposition liquid.
Figure 2:
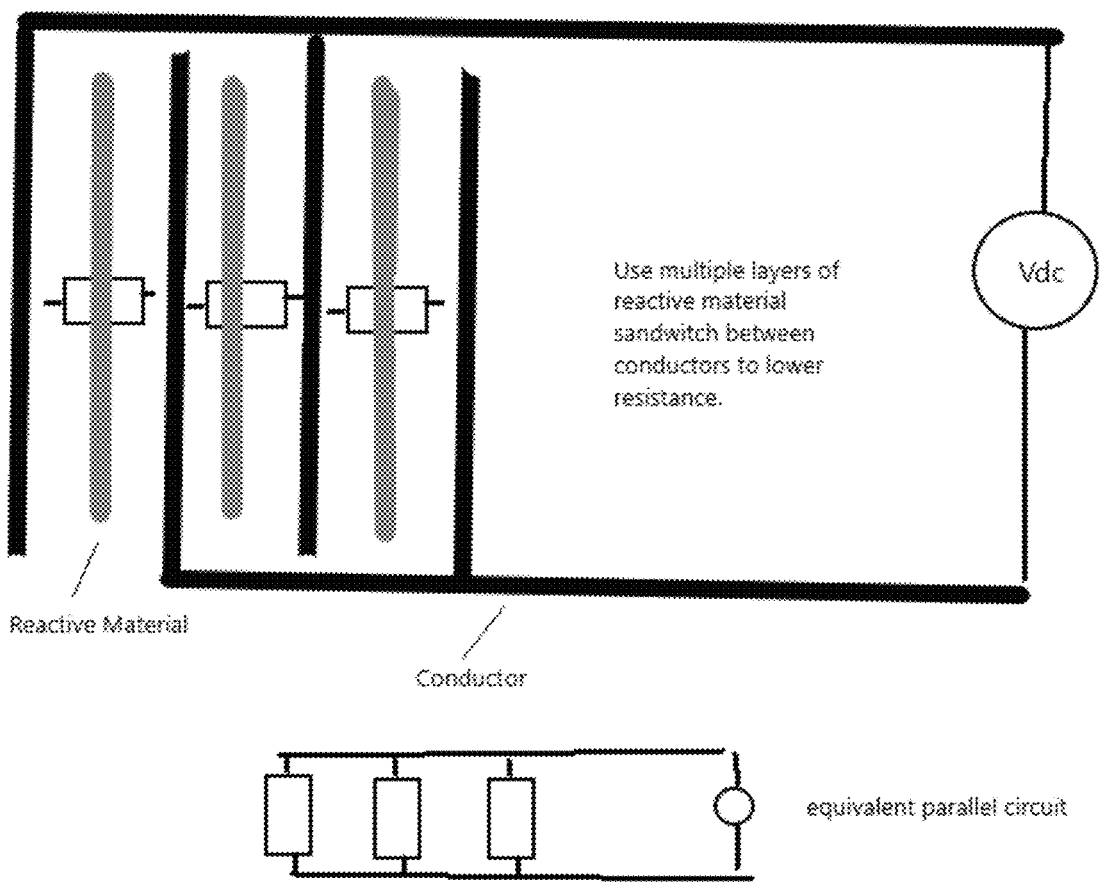
FIG. 2 shows a method of connecting alternating stacked conducting screens to form a parallel electrical network using four screens. Generally, the more screens that are employed, the lower the resistance.

Thus, in general a short length and a large area will lower resistance. Two conductive screens coated with the alumina as shown in FIG. 1 are configured for a large area and short length. Moreover, as shown in FIG. 2 stacking many of the screens with the alumina between them and then electrically wiring the screens in a parallel configuration will further lower the resistance. The above stacked parallel configuration may be connected a resistance measurement system. For example, the stacked parallel configuration may be connected to one or two legs of a resistance measurement system such as a Wheatstone bridge. A small change in the alumina will show as a large change in voltage. This voltage change can readily read by a digital input of a computer. In one specific embodiment the stack of filter material could be placed in an enclosure with an inlet and outlet. It could then be placed in line of the regular filter or be used as a replacement for existing filters.

In another specific embodiment the application pertains to adding a chemical agent or making a physical modification to a filter media such as alumina in order to detect changes easier. Such chemical agents and physical modifications may vary widely depending upon the system, the dielectric fluid, and the filter media. In one specific embodiment a thin piece of conducting material such as copper could be placed across or within the alumina. The conducting material such as copper could be chemically reacted or otherwise fused to the alumina if desired. In this manner, resistivity measurements may be facilitated to indicate changes and more effectively monitor the filter media.

Advantageously, using the systems and methods described herein a voltage that is easily read by a computer may be produced. The reliability and repeatability may meet or even exceed that of a color camera that is, for example, calibrated to tell the difference between pink and white of a pH indicator. Accordingly, more reliable emergency shutdown of cooling immersion equipment may be implemented if a degradation event occurs in the dielectric fluid.

Representative Embodiments

1. A process for monitoring a filter in an immersion cooled system comprising:
employing an alumina filter media to filter fluid wherein the filter fluid's resistivity changes depending upon the pH of the filter fluid; and
measuring the resistivity changes.
2. The process of embodiment 1 further comprising reducing the resistance of the alumina filter media to facilitate measuring resistivity of the fluid.
3. The process of embodiment 2 wherein the reducing comprises stacking electrically wired alumina screens in parallel.
4. The process of embodiment 1 wherein the measuring is conducted with a Wheatstone bridge.
5. The process of embodiment 1 which further comprises employing a conducting material on the alumina filter media to facilitate measuring a change in resistivity of the filter fluid.
6. The process of embodiment 1 wherein the fluid comprises a perfluorocarbon liquid dielectric fluid.
A process for monitoring a filter in an immersion cooled system comprising:
7. employing a filter media to filter fluid wherein one or more electrical properties change depending upon pH of the filter fluid; and
measuring the one or more electrical properties.
8. The process of embodiment 7 wherein the measuring the one or more electrical properties comprises measuring resistivity.
9. The process of embodiment 7 wherein the filter media comprises alumina.
10. The process of embodiment 7 wherein the immersion cooled system comprises a two phase immersion cooling system.
11. The process of embodiment 7 wherein the immersion cooled system comprises a single phase immersion cooling system.
12. The process of embodiment 7 wherein the fluid comprises a perfluorocarbon liquid dielectric fluid.
13. The process of embodiment 7 wherein the fluid comprises an oil.
14. The process of embodiment 7 wherein the fluid comprises a mineral oil.
15. The process of embodiment 7 which further comprises reducing the resistance of the filter media to facilitate measuring resistivity of the fluid.
16. The process of embodiment 15 wherein the reducing comprises stacking electrically wired screens in parallel.
17. The process of embodiment 7 wherein the measuring is conducted with a Wheatstone bridge.
18. The process of embodiment 7 which further comprises employing a conducting material on the filter media to facilitate measuring a change in resistivity of the filter fluid.
19. The process of embodiment 7 which further comprises transmitting the one or more measured electrical properties to a processor.
20. The process of embodiment 19 wherein the processor facilitates a change to the system based on the one or more measured transmitted electrical properties.

In the preceding specification, various embodiments have been described with references to the accompanying drawings. It will, however, be evident that various modifications and changes may be made thereto, and additional embodiments may be implemented, without departing from the broader scope of the invention as set forth in the claims that follow. The specification and drawings are accordingly to be regarded as an illustrative rather than restrictive sense.

I claim:

1. A process for monitoring a filter in an immersion cooled system comprising:
employing an alumina filter media to filter fluid wherein the filter fluid's resistivity changes depending upon the pH of the filter fluid; and
measuring the resistivity changes.

2. The process of claim 1 further comprising reducing the resistance of the alumina filter media to facilitate measuring resistivity of the fluid.

3. The process of claim 2 wherein the reducing comprises stacking electrically wired alumina screens in parallel.

4. The process of claim 1 wherein the measuring is conducted with a Wheatstone bridge.

5. The process of claim 1 which further comprises employing a conducting material on the alumina filter media to facilitate measuring a change in resistivity of the filter fluid.

6. The process of claim 1 wherein the fluid comprises a perfluorocarbon liquid dielectric fluid.

7. A process for monitoring a filter in an immersion cooled system comprising:
employing a filter media to filter fluid wherein one or more electrical properties change depending upon pH of the filter fluid; and
measuring the one or more electrical properties.

8. The process of claim 7 wherein the measuring the one or more electrical properties comprises measuring resistivity.

9. The process of claim 7 wherein the filter media comprises alumina.

10. The process of claim 7 wherein the immersion cooled system comprises a two phase immersion cooling system.

11. The process of claim 7 wherein the immersion cooled system comprises a single phase immersion cooling system.

12. The process of claim 7 wherein the fluid comprises a perfluorocarbon liquid dielectric fluid.

13. The process of claim 7 wherein the fluid comprises an oil.

14. The process of claim 7 wherein the fluid comprises a mineral oil.

15. The process of claim 7 which further comprises reducing the resistance of the filter media to facilitate measuring resistivity of the fluid.

16. The process of claim 15 wherein the reducing comprises stacking electrically wired screens in parallel.

17. The process of claim 7 wherein the measuring is conducted with a Wheatstone bridge.

18. The process of claim 7 which further comprises employing a conducting material on the filter media to facilitate measuring a change in resistivity of the filter fluid.

19. The process of claim 7 which further comprises transmitting the one or more measured electrical properties to a processor.

20. The process of claim 19 wherein the processor facilitates a change to the system based on the one or more measured transmitted electrical properties.

\* \* \* \* \*